United States Patent [19]
Sumnitsch

[11] Patent Number: 6,022,417
[45] Date of Patent: Feb. 8, 2000

[54] SUPPORT FOR WAFER-SHAPED OBJECTS, IN PARTICULAR SILICON WAFERS

[76] Inventor: Franz Sumnitsch, Universitatasstrasse 25, A-9200 Klagenfurt, Austria

[21] Appl. No.: 08/981,930

[22] PCT Filed: Apr. 1, 1996

[86] PCT No.: PCT/AT96/00063

§ 371 Date: Feb. 18, 1998

§ 102(e) Date: Feb. 18, 1998

[87] PCT Pub. No.: WO97/03457

PCT Pub. Date: Jan. 30, 1997

[30] Foreign Application Priority Data

Jul. 12, 1995 [AT] Austria .................................. 1188/95

[51] Int. Cl.$^7$ ..................................................... H01L 21/68
[52] U.S. Cl. ............................................ 118/728; 156/345
[58] Field of Search ..................................... 118/725, 728; 156/345

[56] References Cited

U.S. PATENT DOCUMENTS

| 4,158,987 | 6/1979 | Smith .......................................... 409/80 |
| 4,903,717 | 2/1990 | Sumnitsch ................................. 134/99 |
| 5,230,741 | 7/1993 | Van De Ven et al. ..................... 118/728 |
| 5,291,739 | 3/1994 | Woods et al. ............................. 62/48.01 |
| 5,421,595 | 6/1995 | Cripe et al. ................................. 279/3 |
| 5,738,165 | 4/1998 | Imai .......................................... 165/80.2 |

FOREIGN PATENT DOCUMENTS

| 0 109 080 | 5/1984 | European Pat. Off. . |
| 0 456 426 | 11/1991 | European Pat. Off. . |
| 0 467 623 | 1/1992 | European Pat. Off. . |
| 0 611 273 | 8/1994 | European Pat. Off. . |
| 2 566 682 | 1/1986 | France . |
| 256 952 | 5/1988 | Germany . |

*Primary Examiner*—Bruce Breneman
*Assistant Examiner*—Alva C. Powell
*Attorney, Agent, or Firm*—Young & Thompson

[57] ABSTRACT

In a support for a wafer-shaped object, in particular a silicon wafer, there is an annular nozzle in the surface of the support opposite the wafer-shaped object. The surface of the support includes concentric annular projections for supporting the wafer. Between the projections there is at least one aperture from which a passage extends to a vacuum producing device housed inside the support. As a result of the prevailing vacuum beneath the projections, the object is held in contact with the support and prevented from moving in a direction parallel to the surface, without requiring lateral supports. The compressed gas that creates the vacuum is ejected from the annular nozzle to clean the edges of the wafer-shaped object.

13 Claims, 4 Drawing Sheets

SUPPORT FOR WAFER-SHAPED OBJECTS, IN PARTICULAR SILICON WAFERS

BACKGROUND OF THE INVENTION

The invention relates to a carrier for disk-shaped articles, especially for silicon wafers during etching thereof, with an annular nozzle in the preferably round carrier surface facing the article, to which pressurized gas is supplied, and with at least one annular projection which is provided on the carrier surface facing the article and which is used as a support for the article and which is located within the annular nozzle.

A carrier of this type for disk-shaped articles of the initially mentioned type which holds in place the articles exclusively based on the negative pressure which arises due to the Bernoulli principle is known from EP 611 273 A.

One difficulty in these known carriers according to the Bernoulli principle consists in that the disk-shaped articles essentially float on the gas cushion and therefore are not always securely held in place to an adequate degree.

The object of the invention is to improve the known carrier proceeding from EP 611 273 A such that reliable holding of disk-shaped articles is possible while they are being treated with treatment liquid without the need of retaining cams which are to be placed against the edge of the disk-shaped article and such that the article, even without negative pressure being formed due to the Bernoulli principle, is held securely enough for the stipulated actions.

According to the invention, this object is achieved by the fact that in the surface facing the article within the annular projection, there is at least one opening supplied with negative pressure.

In the carrier according to the invention, the disk-shaped article is drawn against the annular projection provided in the carrier surface facing the article. Since the projection in the invention engages the disk-shaped article off its center, the article is securely held during treatment (no danger of tilting) and the article can be rotated by turning the carrier since the projection engages the article off center and therefore torques can be transmitted from the carrier to the disk-shaped article. Because within the annular projection there is an opening supplied with negative pressure in the carrier surface facing the disk-shaped article, a sufficient contact pressure is reached between the projection and the article. In addition, an advantage arises which consists in that the treatment medium in the case of a fracture of the disk-shaped article is exhausted by the carrier and cannot reach downstream system parts.

One embodiment of the invention provides that the annular projection is an annular rib on the carrier surface facing the disk-shaped article. In this embodiment, the annular rib which forms at least one annular projection is formed preferably in one piece with the carrier part which lies inside the annular nozzle and projects above the carrier surface which faces the disk-shaped article.

The invention also extends to an embodiment in which it is provided that there are several annular projections concentric to one another. To guarantee that also between the annular projections negative pressure prevails which moves the disk-shaped article against the annular projections, it can be provided that within the innermost annular projection and between the annular projections there is at least one opening each supplied with negative pressure. In an alternative embodiment it can be provided that within the outermost annular projection there is at least one opening supplied with negative pressure and that each annular projection with the exception of the outermost projection is interrupted at least once. In this embodiment, the opening supplied with negative pressure can be located anywhere within the outermost annular projection, therefore also within the innermost annular projection or between annular projections that are adjacent to one another.

The annular projection need not be formed in one piece with the carrier, but it can also be a ring inserted into the carrier surface facing the article.

It can be advantageous if the annular projection is resilient in the direction perpendicular to the carrier surface facing the article. In this way, the projection yields elastically in the direction to the carrier surface facing the disk-shaped article so that an equilibrium state arises which precludes deformations of the disk-shaped article, as can occur in a rigid projection which fits tightly only in the center of the article according to EP 48 995 A if the projection is not correctly dimensioned. Still, the disk-shaped article is also held securely in place in the direction parallel to the carrier surface facing the article such that it can be treated with a treatment liquid and can be turned to spin the latter off.

In a three-dimensionally especially favorable embodiment of the invention, it can be provided that the annular projection is located concentrically to the axis of the carrier.

One embodiment of the invention calls for the fact that the annular projection is supported against the carrier by elastic elements. In this way, resiliency can be achieved independently of the material which comprises the annular projection. In this case it can be provided in a simple embodiment that the elastic elements are helical springs.

In the invention, it can be provided that the annular projection is inserted into an annular groove or into a circular depression in the carrier surface facing the article. In this embodiment, the fit of the annular projection on the carrier is achieved in a special manner.

In one embodiment of the carrier according to the invention, the annular projection consists of teflon-coated silicone. In this embodiment as well the material of the ring is not attacked by the treatment medium even if it is an acid.

One embodiment can still be characterized in that the annular projection is hollow. For this reason the annular projection is easily elastic enough.

Another embodiment of the carrier according to the invention is characterized in that a line proceeds from the opening and leads to a means which produces negative pressure. In this embodiment, it is especially easy to supply negative pressure to the opening provided within the annular projection.

If according to one proposal of the invention it is provided that the means which produces negative pressure is an injector nozzle, the advantage arises that the means which produces the negative pressure can be operated by the compressed gas supplied to the annular nozzle of the carrier and separate pumps or the like are unnecessary for supplying the opening within the annular projection with negative pressure.

In another embodiment of the invention, it can be provided that pressurized gas which is supplied to the annular nozzle flows through the injector nozzle. In this embodiment, mechanical moving parts are unnecessary so that a durable and still reliable construction results.

One arrangement which is especially three-dimensionally favorable arises when the means which produces negative pressure is located in the carrier.

BRIEF DESCRIPTION OF THE DRAWINGS

Other details and advantages of the invention follow from the description below of the embodiments of the carriers of the invention shown in the drawings.

Here.

DESCRIPTION OF THE PREFERRED EMBODIMENTS

Figure 1:
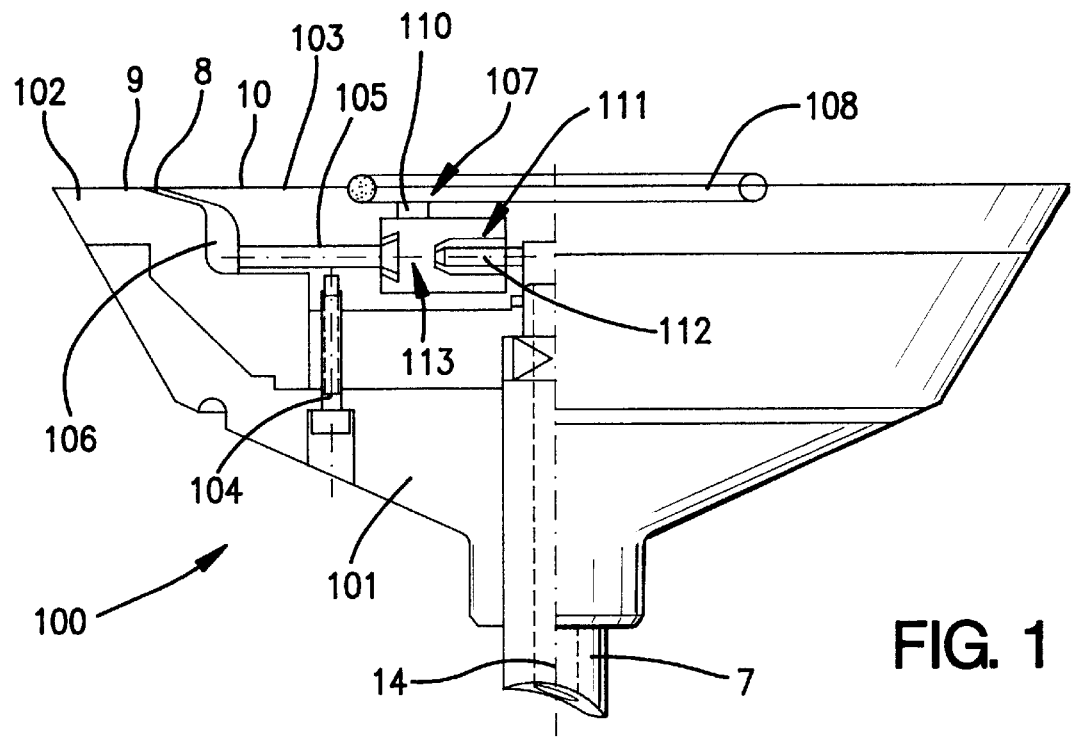
FIG. 1 shows a partially-sectioned carrier.
Figure 2:
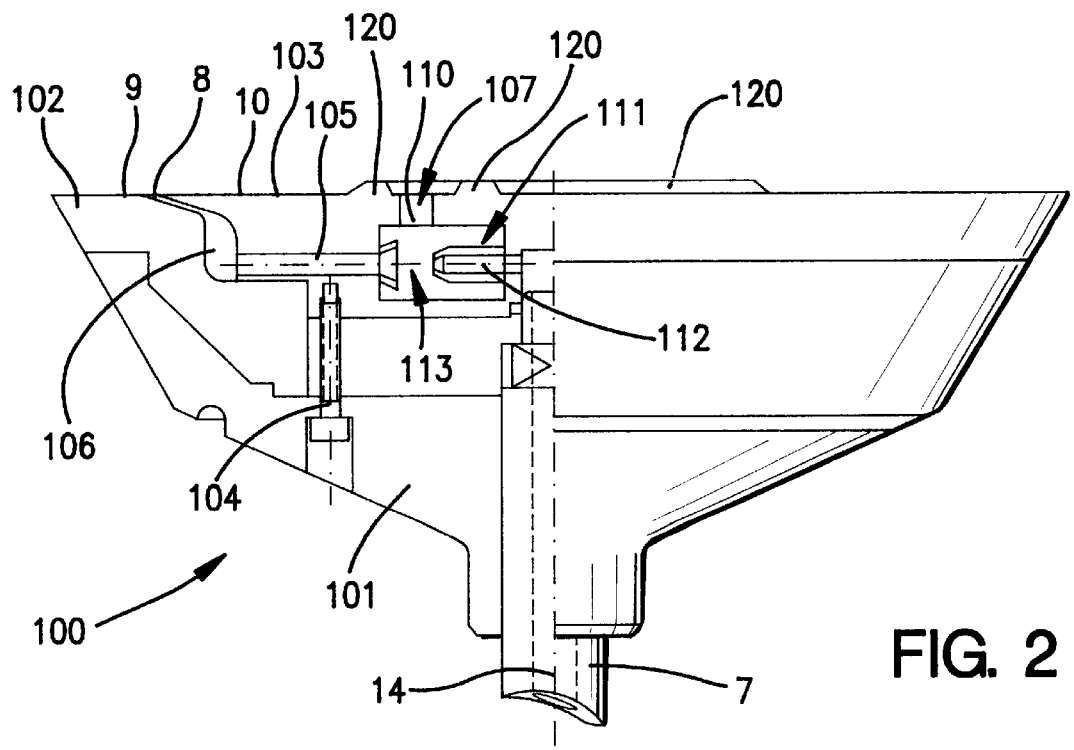
FIG. 2 shows another embodiment of the partially-sectioned carrier.

In the embodiment shown in FIGS. 1 and 2, carrier 100 consists of several rotationally-symmetrical parts, specifically lower pot-shaped part 101, annular part 102 and plate-shaped, round part 103, which is attached by screws 104 to pot-shaped part 101 and in doing so holds annular part 102 in place. Between annular part 102 and center circular, plate-shaped part 103, there is annular nozzle 8 for emergence of gas which is supplied via shaft 7 which is hollow through a channel 14 and several radial openings 105 to space 106 between annular part 102 and circular, plate-shaped part 103. The inner width of the annular nozzle can be set by a spacer ring 130 that is inserted between parts 102 and 103 (cf. FIG. 3).

As shown in FIG. 1, space 106 between two parts 102 and 103 in which pressurized gas, such as, for example, air or nitrogen can be introduced via hollow (channel 14) shaft 7, discharges into an annular nozzle 8 whose boundary walls formed by parts 102 and 103 enclose an acute angle with upper end surfaces 9 and 10 of carrier 100.

The upper end surface of carrier 100 facing the article to be held is formed by circular annular surface 9 of part 102 and circular surface 10 of part 103. Annular nozzle 8 in the end surface of carrier 100 discharges between circular annular surface 9 and circular surface 10.

Figure 2A:
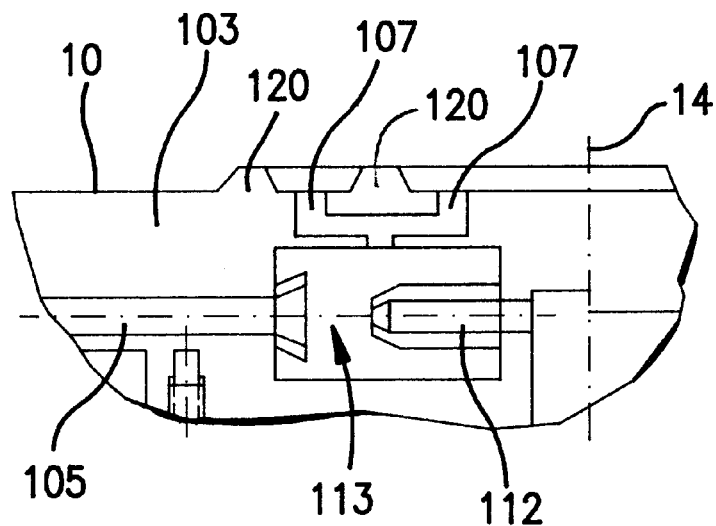
FIGS. 2a to 2d in partial views show other embodiments of the carrier.
Figure 2B:
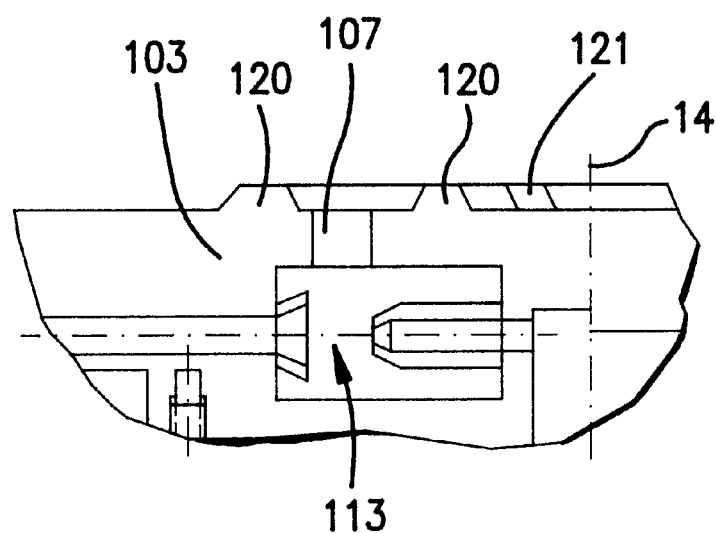

In surface 10 of circular, plate-shaped part 103, the surface facing the disk-shaped article (not shown), there is a circular depression. Ring 108, which forms an annular projection and which consists of, for example, silicone and can be resilient, is inserted into this depression. Ring 108 made of silicone can be coated on its outside surface with teflon. Ring 108 can be a ring made of solid material (e.g., polyvinylidene fluoride) or (as shown in FIG. 2d) can be hollow, in such a way that ring 108 can be resilient in the direction of the axis.

Figure 2C:
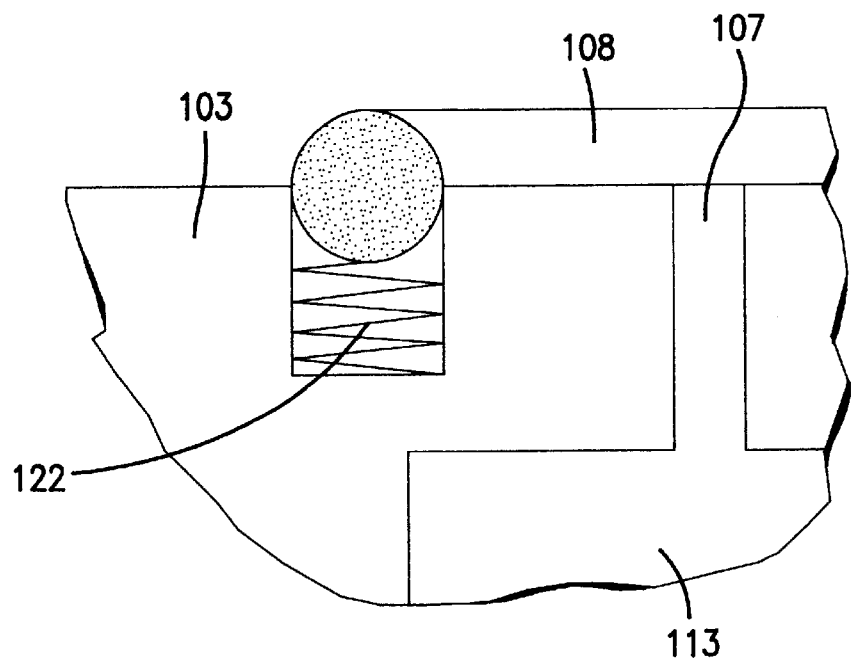
Figure 2D:
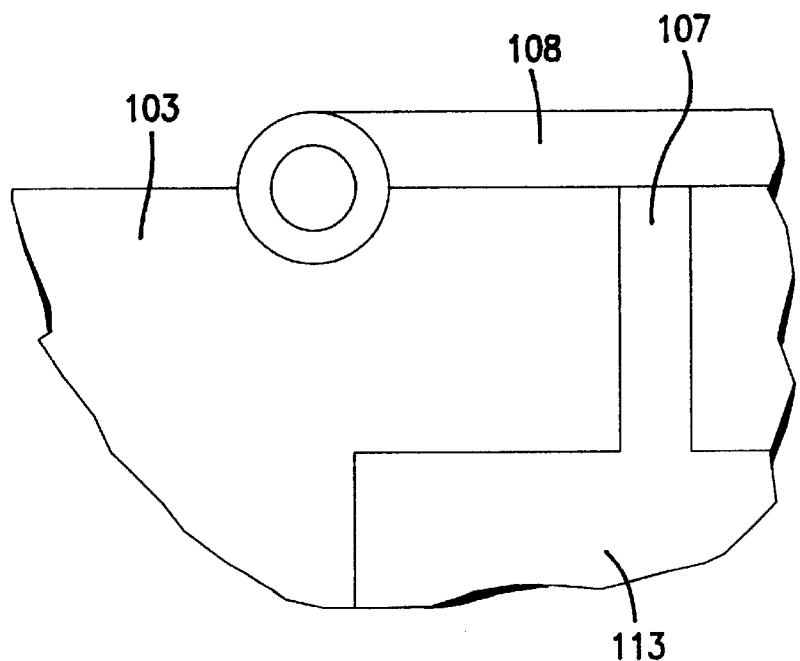

It should be pointed out that ring 108 can be elastically supported on its side facing carrier 100 by elastic means, e.g., several helical springs 122, i.e., it need not rest directly on the bottom of the flat depression in part 103 of carrier 100 (see FIG. 2c).

In part 103 of carrier 100 in place of the depression, there can also be a round groove which is roughly semicircular in cross section and into which ring 108 is inserted.

Ring 108, if it is elastic or elastically supported, is roughly compressed elastically under the action of the negative pressure between the disk-shaped article and surface 10 of carrier 100 facing the article, in such a way that the disk-shaped article is securely held on carrier 100 and also cannot move laterally.

In order to produce negative pressure in the area within ring 108, in carrier 100 according to the invention there is opening 107, which is supplied with negative pressure in surface 10 of part 103 facing the disk-shaped article.

In particular, line 110 which leads to means 111, which produces negative pressure and which is accommodated in part 103 of carrier 100, proceeds from opening 107, as is shown in the embodiment. Means 111, which produces negative pressure, comprises an injector nozzle 112, which is provided in chamber 113, which is relieved in part 103 of carrier 100. Injector nozzle 112 is provided with compressed gas supplied through channel 14 in shaft 7 so that in space 113 negative pressure is formed which propagates through line 110 to opening 107. The compressed gas emerging from injector nozzle 112 then flows into (at least) one radial hole 105, into space 106 and out of the latter via annular nozzle 8.

If in carrier 100 according to the invention there are several radial holes 105 for the compressed gas, then several means 111 which generate negative pressure and accordingly several openings 107 can be provided within ring 108.

Because within ring 108 there is negative pressure, if a disk-shaped article rests on ring 108, and compressed gas is supplied to injector nozzle 112, retention of the disk-shaped article on ring 108 and thus on carrier 100 is further improved.

In the carrier designed according to the invention, it is no longer important in either the embodiment shown in FIG. 1 or FIG. 2 for securely holding a disk-shaped article in place on carrier 100 that by means of the special design of annular nozzle 8 as the gas flows out of annular nozzle 8 between end surfaces 9 and 10 of carrier 100 facing the article and the article a negative pressure is formed which holds the disk-shaped article against annular projection 108, 120. This negative pressure which may form according to the Bernoulli principle, however, can advantageously support holding the article securely in place. In the invention the compressed gas flowing out of annular nozzle 8 provides primarily for the fact that treatment liquid cannot reach the bottom of the disk-shaped article and can cause corrosion on carrier 100. In addition, the compressed gas flowing out of annular nozzle 8 advantageously supports spinning off of the treatment medium by blowing off the drops of the treatment medium which are spun off of the periphery of the disk-shaped article.

In addition, the advantage arises that, and this is especially important in the etching of silicon wafers with acid treatment media, in the case of fracture of a disk-shaped article the treatment medium, which reaches part 103 of carrier 100 within ring 108 or an annular projection 120, is sucked out through opening 107 so that further damage is avoided.

In the embodiment of a carrier 100 shown in FIG. 2 for disk-shaped articles, annular projection 120 is formed by two annular ribs which are formed in one piece with part 103 and which can be arranged concentrically to one another and coaxially to axis 14 of carrier 100. These annular ribs, however, need not necessarily be made in one piece with the material of part 103 of carrier 100, but can also be separate rings which are attached to part 103 of carrier 100. This also offers the possibility of making annular projections 120 resilient and/or resiliently supported on part 103 as has been described above for ring 108.

If as in the embodiment shown in FIG. 2 there is more than one annular projection 120, then either within innermost annular projection 120 and between each annular projection 120, there are openings 107 in order that the negative pressure can take effect within innermost annular projection 120 and between annular projections 120, as is shown in FIG. 2a.

Alternatively, as is shown in FIG. 2b, it can be provided that in each of annular projections 120, with the exception of outermost annular projection 120, there is a radially aligned interruption 121. This radially aligned interruption—in the simplest case a radial groove 121—provides for the fact that the negative pressure applied via opening 107 located anywhere within outermost annular projection 120 can spread over the entire area within outermost annular projection 120.

Figure 3:
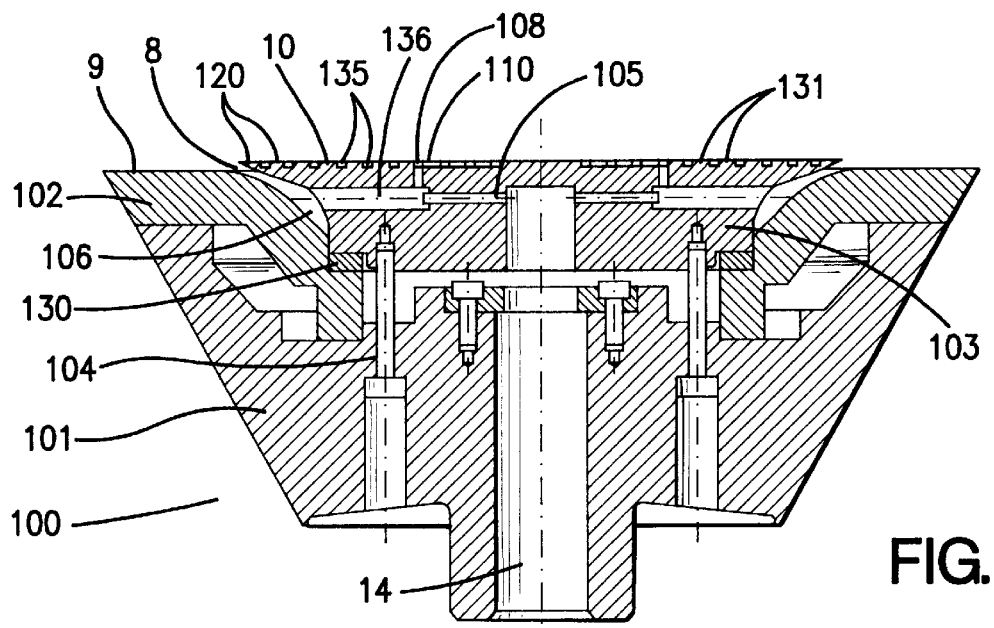
FIG. 3 shows another embodiment in axial section.
Figure 4:
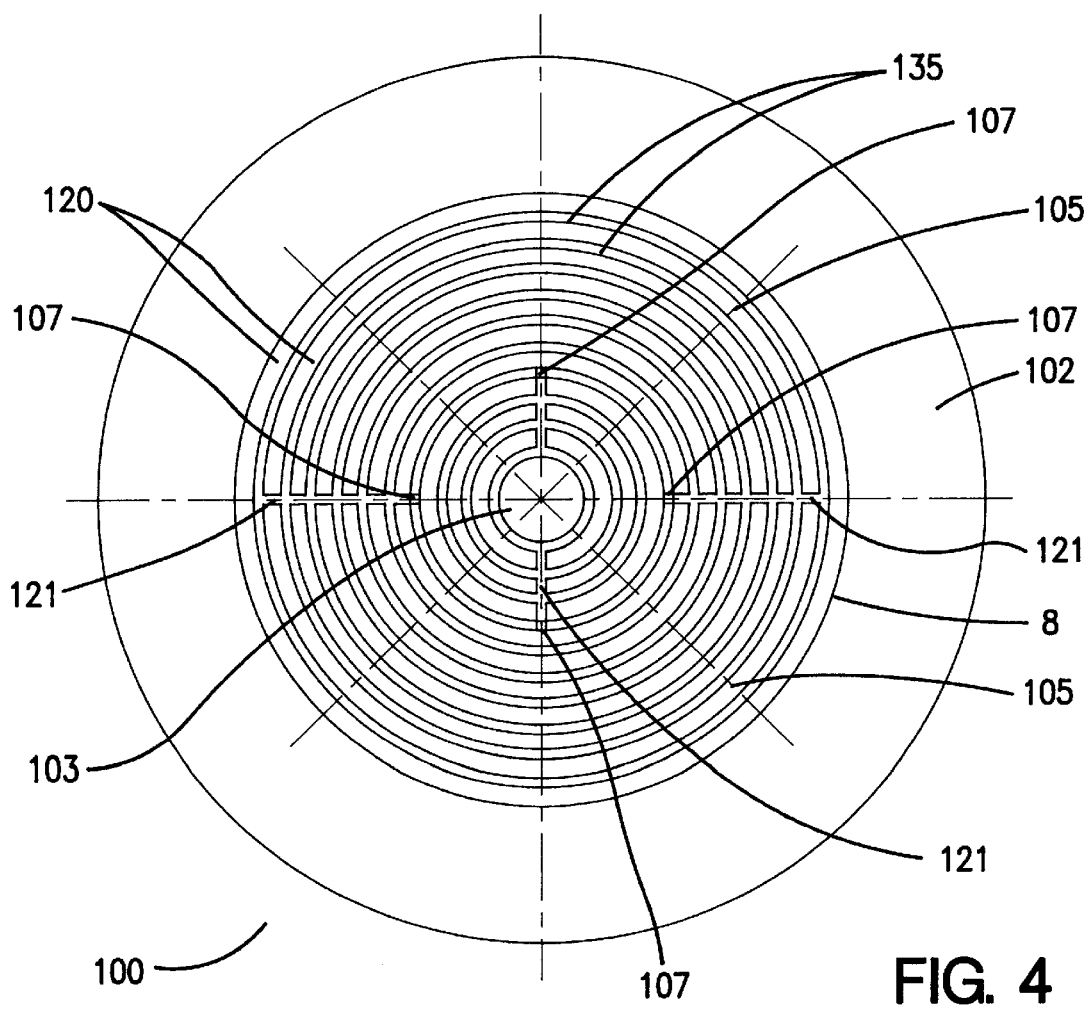
FIG. 4 shows a top view of the carrier from FIG. 3.

In the embodiment shown in FIGS. 3 and 4, carrier 100 consists of three rotationally-symmetrical parts, namely lower pot-shaped part 101, annular part 102 and plate-shaped part 103, which is attached by screws 104 to pot-shaped part 101, whereby with the addition of a spacer ring 130, which is used to adjust nozzle 8, annular part 102 is clamped against the bottom of pot-shaped part 101.

Between annular surface 9 of annular part 102 facing the article (not shown), e.g., a silicon wafer, and surface 10 of part 103 facing the article, an annular nozzle 8 is provided for the discharge of gas, which flows into annular nozzle 8 under pressure via several channels 105, which extend radially.

As can be seen from FIG. 3, surface 10 of part 103 of carrier 100 from ring surfaces 131, surface facing the article, forms annular projections 120, which are arranged uniformly distributed over surface 10 of part 103. All annular projections 120 are designed to be of equal width and are separated from one another by grooves 135 that are also made of equal width.

From sections 136 with enlarged diameters of individual channels 105, lines 110, which are parallel to each other's axes, lead to openings 107, which are supplied with negative pressure because of the injector nozzle-like action of sections 136 with enlarged diameters of channels 105, if pressurized gas from channel 14 flows into annular nozzle 8.

In the embodiment shown (FIG. 4), four openings 107 are provided, which are arranged distributed uniformly on a circle, whose radius is smaller than half of the largest radius of part 103, namely the radius of the peripheral edge, which limits annular nozzle 8 inward.

To distribute the negative pressure applied via opening 107 in all grooves 135 that are arranged outside openings 107 between annular projections 120, annular projections 120 are each provided twice with interruptions 121, whereby interruptions 121 lie on radial lines. Correspondingly, annular projections 120 that are inside openings 107 are twice interrupted by interruptions 121 so that grooves 135 that are between the latter are also supplied with negative pressure.

By the negative pressure generated by sections 136 of channels 105 that act like injector nozzles and passed on through openings 107 into all grooves 135, a disk-shaped article is sucked in uniformly on ring surfaces 131 of annular projections 120 over the entire area of surface 10 of part 103 of carrier 100, so that it is held securely in place.

Radial channels 105, which are designed without sections 136 with enlarged diameters that act as injector nozzles, can be provided in addition and run preferably to channels 105 that are equipped with sections 136 that have enlarged diameters and are arranged, for example, in each case in the center between two such channels 105. As a result, annular nozzle 8 is especially uniformly supplied with pressurized gas fed via channel 14.

Also, in the embodiment of a carrier 100 that is designed according to the invention and is shown in FIGS. 3 and 4, to hold a disk-shaped article securely on carrier 100, it is no longer essential that by a special design of annular nozzle 8 when gas flows out from annular nozzle 8, negative pressure, which holds the disk-shaped article, develops between surface 9 of carrier 100, surface facing the article, and the article. This negative pressure that may develop according to the Bernoulli principle can advantageously support, however, holding the article on carrier 100 according to the invention.

In summary, the invention can be described, for example, as follows:

In carrier 100 for a disk-shaped article, especially a silicon wafer, there is an annular nozzle 8 in surface 10 of carrier 100 facing the disk-shaped article. A ring 108 is provided on surface 10 facing the article. Within ring 108 is at least one opening 107 from which a line 110 leads to means 111 which generates negative pressure and which is housed in carrier 100. By means of the negative pressure which prevails within ring 108, the article is held against ring 108 of carrier 100 optionally supported by the negative pressure which is present outside ring 108 due to the Bernoulli principle and cannot be shifted in the direction parallel to surface 10 without it being necessary to provide lateral supports such as cams or the like. Because lateral supports are not necessary, they do not prevent treatment liquid from flowing off of the disk-shaped article.

What is claimed is:

1. A carrier for disk-shaped articles, comprising an annular nozzle in a round surface of the carrier for facing the article, to which pressurized gas is supplied, and with at least one annular projection which is hollow and is on said surface which is used as a support for the article and which is located radially interior to said annular nozzle, wherein said surface radially interior to said annular projection comprises at least one opening supplied with negative pressure.

2. A carrier for holding and rotating wafer-shaped articles, said carrier comprising:

an annular nozzle in a round surface of the carrier for facing the article, to which compressed gas is supplied;

plural negatively pressurized openings in said surface;

plural annular ribs concentric to one another projecting from said surface for supporting the article, said annular ribs being located radially interior to said annular nozzle, said negatively pressurized openings being located between a radially outermost and radially innermost of said annular ribs;

wherein from each of said negatively pressurized openings a line proceeds which leads to a different one of plural injector nozzles, each of which produces a negative pressure and is located in the carrier, the compressed gas being supplied to said annular nozzle flowing through said injector nozzles.

3. The carrier as claimed in claim 2, wherein each of said annular ribs with the exception of a radially outermost one of said annular ribs, has at least one interruption.

4. The carrier as claimed in claim 2, wherein said negatively pressurized openings are located on a circle concentric to an axis of the carrier and further comprising a plurality of said interruptions that proceed radially inwardly and radially outwardly from said negatively pressurized openings.

5. The carrier as claimed in claim 2, wherein an entirety of said surface is provided with said annular ribs.

6. The carrier as claimed in claim 2, wherein said radially outermost annular rib is directly adjacent to a periphery of an edge of said surface which borders said annular nozzle radially inside said nozzle.

7. The carrier as claimed in claim 2, wherein a distance of said negatively pressurized openings from an axis of the carrier is smaller than half a radius of said surface which lies radially within said annular nozzle.

8. The carrier as claimed in claim 2, wherein said injector nozzles are expansions in flow channels which extend radially outwardly from a gas supply channel which is located in a center of the carrier and through which the compressed gas is supplied.

9. The carrier as claimed in claim 8, wherein said negatively pressurized openings are on radially inside ends of said expansions of said flow channels.

10. The carrier as claimed in claim 8, wherein between each of said flow channels which has an injector nozzle there is at least one further channel which has no injector nozzle and which extends radially outwardly from said gas supply channel.

11. The carrier as claimed in claim 2, wherein said flow channels which have injector nozzles and said further channels without injector nozzles are located in a round part of which said surface is a part.

12. The carrier of claim 2, wherein each of said injector nozzles is in a separate chamber in the carrier and has an axis substantially parallel with a plane of said surface, and each of said injector nozzles is arranged and constructed to negatively pressurize a portion of the respective said chamber when the compressed gas is injected through the respective said injector nozzle, each said chamber having a first output directly opposite and coaxial with the respective said injector nozzle in gaseous communication with said annular nozzle that provides the compressed gas thereto and a second output at said negatively pressurized portion in gaseous communication with a respective one of said negatively pressurized openings for negatively pressurizing said one of said openings.

13. In a carrier for holding a wafer that includes a support surface with an annular nozzle for jetting compressed air at edges of the wafer, plural negatively pressurized openings radially interior to the annular nozzle for holding the wafer with a negative pressure, and a chamber connected to the openings and annular nozzle and with an injector nozzle connected to a source of compressed gas for creating a negative pressure for the negatively pressurized openings, where the compressed gas that creates the negative pressure is the compressed gas that is jetted from the annular nozzle, the improvement comprising a plurality of said chambers in said carrier, each of said chambers having a respective one of said injector nozzles therein for creating the negative pressure for a respective one of said negatively pressurized openings, and plural passageways, each connecting a respective one of said chambers to the annular nozzle, each of said passageways having a longitudinal axis that is coaxial with the respective one of said injector nozzles and that is substantially parallel to a plane of the support surface so that the compressed gas from the respective one of said injector nozzles is directly ejected into the respective one of said passageways leading to the annular nozzle.

* * * * *